United States Patent [19]

Irving et al.

[11] Patent Number: 4,849,320

[45] Date of Patent: Jul. 18, 1989

[54] METHOD OF FORMING IMAGES

[75] Inventors: Edward Irving, Burwell; Christopher P. Banks, Saffron Walden, both of England

[73] Assignee: Ciba-Geigy Corporation, Ardsley, N.Y.

[21] Appl. No.: 45,022

[22] Filed: Apr. 30, 1987

[30] Foreign Application Priority Data

May 10, 1986 [GB] United Kingdom ................ 8611480
Jun. 14, 1986 [GB] United Kingdom ................ 8614529

[51] Int. Cl.$^4$ ................ G03C 5/16; G03C 1/68; G03C 1/70; G03C 1/71

[52] U.S. Cl. .................... 430/280; 430/327; 430/494; 430/394; 430/330; 430/281; 430/194; 430/195; 522/4; 522/107; 522/25; 522/15; 522/13; 522/100; 522/170; 522/103; 522/66; 522/18; 522/12; 522/17

[58] Field of Search .............. 430/327, 494, 394, 330, 430/280, 281, 194, 195; 522/4, 15, 13, 18, 12, 17, 66

[56] References Cited

U.S. PATENT DOCUMENTS

| | | | |
|---|---|---|---|
| 4,058,400 | 11/1977 | Crivello | 96/115 P |
| 4,058,401 | 11/1977 | Crivello | 96/115 P |
| 4,182,665 | 1/1980 | Mibu et al. | 204/159.15 |
| 4,291,118 | 9/1981 | Boduch et al. | 430/313 |
| 4,299,938 | 11/1981 | Green et al. | 525/343 X |
| 4,339,567 | 7/1982 | Green et al. | 528/417 X |
| 4,351,708 | 9/1982 | Berner et al. | 522/25 |
| 4,383,025 | 5/1983 | Green et al. | 430/280 |
| 4,413,052 | 11/1983 | Green et al. | 430/327 |
| 4,416,975 | 11/1983 | Green et al. | 522/4 |
| 4,428,807 | 1/1984 | Lee et al. | 522/25 X |
| 4,500,629 | 2/1985 | Irving et al. | 430/325 |
| 4,518,676 | 5/1985 | Irving | 430/280 |
| 4,546,067 | 10/1985 | Irving et al. | 430/330 X |
| 4,572,890 | 2/1986 | Goodin et al. | 430/325 |
| 4,601,973 | 7/1986 | Bauer | 430/910 X |

FOREIGN PATENT DOCUMENTS

| | | |
|---|---|---|
| 8424454 | 2/1983 | Australia . |
| 82603 | 6/1983 | European Pat. Off. . |
| 144148 | 6/1985 | European Pat. Off. . |
| 85/01947 | 5/1985 | PCT Int'l Appl. . |
| 1479742 | 7/1977 | United Kingdom . |
| 1516352 | 7/1978 | United Kingdom . |
| 2108508 | 5/1983 | United Kingdom . |
| 2119810 | 11/1983 | United Kingdom . |
| 2127714 | 1/1986 | United Kingdom . |

OTHER PUBLICATIONS

Derwent 83-828644.
Derwent 84-296088.
Derwent 83-828645.
Derwent 86-171084.
Kirk-Othmer Encyclopedia, vol. 7, (1969), pp. 532-534.
Kirk-Othmer Encyclopedia, vol. 20, (1969), pp. 194-197.

Primary Examiner—Paul R. Michl
Assistant Examiner—Cynthia Hamiliton
Attorney, Agent, or Firm—Luther A. R. Hall

[57] ABSTRACT

The invention provides a process for the production of an image which comprises (i) applying to a substrate a layer of a liquid composition comprising
  (A) a cationically polymerizable residue
  (B) a radiation-activated polymerization initator for (A)
  (C) a radiation-curable residue that is different from (A) and optionally
  (D) a radiation activated initiator for the cure of (C), (ii) subjecting the composition to actinic radiation having a wavelength at which initiator (B) is activated but at which the residue (C) and/or initiator (D) is not substantially activated, followed by heating, if necessary, so that (A) is polymerized and the layer of liquid composition is solidified, but remains curable, (iii) subjecting the solidified layer in a predetermined pattern to actinic radiation having a wavelength that is different from that of the radiation used in stage (ii) and at which the radiation-curable residue (C) and/or the initiator (D) is activated, such that in the exposed areas (C) is substantially cured, and (iv) removing areas of the solidified layer that have not been substantially cured.

20 Claims, No Drawings

METHOD OF FORMING IMAGES

This invention relates to a method for forming images from liquid coatings on substrates involving exposures to actinic radiation at different wavelengths.

Conventionally, production of an image by means of photopolymerisation is achieved by coating a support with a solution in a volatile organic solvent of a photopolymerisable substance, causing or allowing the solvent to evaporate so leaving a film of the photopolymerisable substance, irradiating the film with actinic radiation as through an image whereby the parts of the film struck by the irradiation become photopolymerised (and less soluble) while those parts shielded from the irradiation remain substantially unaffected, then dissolving away the unirradiated, unphotopolymerised parts of the film by means of a suitable solvent which does not dissolve the irradiated, photopolymerised parts. This last stage is conventionally known as "development".

It would be desirable to have a process in which a layer of a photopolymerisable substance were applied to a support and this layer were converted into a substantially solid, non-tacky state, ready for irradiation through an image, without the use of organic solvents. Not only would, in this stage, the use be avoided of solvents which might present problems of toxicity and flammability and also cause expense in their recovery, but production on a continuous basis of coated supports, ready for imagewise irradiation, would be faciliated.

We have found that this object can be achieved by the use of certain liquid compositions containing either two or more materials, or at least one dual functional material, or both, one of which is polymerisable by the application of actinic radiation at one wavelength, and the other is polymerisable by the application of actinic radiation at a second, and different wavelength. Solidification is effected by exposure to actinic radiation at one wave-length to which the mixture is sensitive, giving a stable, solid, but still photosensitive layer. However, since the other radiation-sensitive material or function is only sensitive at a different wavelength, prolonged exposure to radiation of the first wavelength has a negligible effect on the solidified material. It may therefore be solidified using the first wavelength without requiring very careful control over treatment times, and, following this, may be stored for prolonged periods, in the absence of radiation of the second wavelength. When desired, parts of the composition are exposed to the radiation of the second wavelength at which the composition is sensitive. Further polymerisation then occurs in the exposed areas, so that a difference in physical properties is caused between those areas receiving the second exposure and those not receiving the second exposure. Contact with a suitable solvent or other means of development removes the area not exposed to the second wavelength and so a negative image is formed.

U.S. Pat. No. 4,291,118 describes a method for forming relief images from a film of a liquid photopolymerisable material, comprising solidifying the film by chemical hardening, usually by exposure to actinic radiation, then re-exposing the solidified film to actinic radiation in the form of a pattern so that parts of the film become chemically differentiated, and then selectively removing the portions of the film not exposed to the patterned exposure to actinic radiation by washing with a solvent. There is no mention of the possibility of using actinic radiation of two different wavelengths for the two exposures. In the example given, both exposures are to radiation from the same stationary pulse xenon source. The only photopolymerisable materials mentioned are mixtures of polyenes with polythiols. This method is not easy to carry out successfully. When the initial solidification is carried out by irradiation, great care must be taken to give the right amount of irradiation since, if too little is given, the liquid composition will not solidify and if too much is given it will not be possible to obtain a good image after the second irradiation. Furthermore, the reaction between the polyene and the polythiol, which is initiated on exposure to actinic radiation, continues when such exposure is interrupted. For this reason the specification recommends commencing the second irradiation less than 30 minutes, and preferably less than 10 minutes after the first irradiation, stating that, in many systems, a retention time between treatments of 30 minutes or longer would result in the inability to attain a proper differentiation in the chemical condition in the solidified mass. This time limitation is a further constraint on industrial utilisation of the process.

This invention therefore provides a process for the production of an image which comprises
 (i) applying to a substrate a layer of a liquid composition comprising
  (A) a cationically polymerisable residue,
  (B) a radiation-activated polymerisation initiator for (A)
  (C) a radiation-curable residue that is different from (A) and optionally
  (D) a radiation-activated initiator for the cure of (C),
 (ii) subjecting the composition to actinic radiation having a wavelength at which the initiator (B) is activated but at which the residue (C) and/or the initiator (D) are not substantially activated such that (A) is polymerised and the layer of liquid composition is solidified, but remains photocurable,
 (iii) subjecting the solidified layer in a predetermined pattern to actinic radiation having a wavelength that is different from that of the radiation used in stage (ii) and at which the radiation-curable residue (C) and/or the initiator (D) is activated, such that in the exposed areas (C) is substantially cured, and
 (iv) removing areas of the solidified layer that have not been substantially cured.

The expression "subjecting . . . in a predetermined pattern to actinic radiation" includes both exposure through an image-bearing transparency consisting of opaque and transparent parts, and also subjection to a beam of actinic radiation moved in a predetermined pattern, for example as directed by a computer so as to form an image.

The curable liquid compositions used in accordance with the present invention may comprise a mixture of one or more cationically polymerisable substances, together with one or more substances that are polymerised by exposure to actinic radiation only at a different wavelength from that used to activate the polymerisation initiator (B). Alternatively, it may comprise one or more "dual-functional" substances, that is substances having in the same molecule two types of photopolymerisable function, one of which is activated only by irradiation at a wavelength that is different from that at which the polymerisation initiator (B) may be activated. The compositions may further comprise a mixture of one or more dual functional substances, as described, together with one or more single functional substances.

In one method, the first irradiation is effected using radiation in the visible spectrum, and the second irradiation is effected using ultraviolet radiation; however both irradiations may be made using ultraviolet radiation, but of different wavelengths, or both irradiations may be made using radiation in the visible spectrum, but of different wavelengths.

Polymerisation initiator (B) must absorb radiation at a different wavelength from either residue (C) and, if present, from initiator (D). Where residue (C) and initiator (D) absorb radiation at shorter wavelength than initiator (B), they preferably do not absorb radiation at a wavelength above 500 nm.

Residues that are cationically polymerisable suitable for use as part (A) of the liquid composition, are well known and may be, for example, a cationically polymerisable heterocyclic compound such as a cyclic ether, e.g. an oxetane or a tetrahydrofuran or a cyclic ester, e.g. a lactone or an episulphide, e.g. ethylene sulphide. Preferably (A) is a 1,2-epoxide, a vinyl ether or a mixture thereof. Suitable 1,2-epoxides include ethylene oxide, propylene oxide and epichlorohydrin. Preferred 1,2-epoxides are glycidyl ethers of alcohols or phenols, particularly monohydric alcohols or phenols, e.g. n-butyl glycidyl ether, n-octyl glycidyl ether, phenyl glycidyl ether and cresyl glycidyl ether, cyclo-aliphatic epoxides, including monoepoxides such as alpha-pinene oxide and epoxy resins such as 3,4-epoxycyclohexyl-methyl-3′, 4′-epoxycyclohexane carboxylate and its 6,6′-dimethyl derivative, and glycidyl esters, particularly of monocarboxylic acids such as propionic, cyclohexane carboxylic and benzoic acids. Suitable vinyl ethers include cyclic vinyl ethers containing a dihydropyran residue and, preferably, vinyloxyalkyl ethers of phenols.

A wide range of polymerisation initiators for A may be used. For instance, the radiation activated polymerisation initiator for (A) may be at least one compound of the formula (I):

(I)

wherein L is a divalent to heptavalent metal or non metal, Q is a halogen atom or one of the groups Q may be a hydroxyl group, q is an integer from 1 to 3, m is an integer corresponding to the valency of L+q, a is 1 or 2 and n is an integer of 1 to 3 and R is an ion selected from:

Ar—I$^+$—Ar′ (i)

wherein Ar and Ar′ are substituted or unsubstituted aromatic radicals;

[Y—Z—(CO)$_x$]$^+$ (ii)

wherein Y represents an arene or dienylium group; Z represents an atom of a d-block transition element chosen from titanium, vanadium, chromium, manganese, iron, cobalt, nickel, copper, noibium, molybdenum, ruthenium, rhodium, palladium, silver, tantalum, tungsten, rhenium, osmium, iridium, platinum and gold; and x is a positive integer such that the atom Z has a closed shell electron configuration;

aromatic diazonium ions; (iii)

[(R$^1$)(R$^2$M)$_a$]$^{+an}$ (iv)

wherein a is 1 or 2; n is an integer from 1 to 3; M is the cation of a monovalent to trivalent metal from groups IVb to VIIb, VIII or Ib of the Periodic Table; R$^1$ is a π-arene and R$^2$ is a π-arene or the anion of a π-arene;

aromatic sulphonium ions; and (v)

aromatic sulphoxonium ions. (vi)

When R is an iodonium salt, the initiator may have the formula (II)

(II)

wherein Ar is a monovalent aromatic radical; Ar′ is a divalent aromatic radical; h is 0 and i is 1 or h is 2 and i is 0; j=k—1; l is the valence of L; and k is greater than 1 and is an integer having a value up to 8; and L, Q and m are as defiend above.

Radicals included by Ar can be the same or different, aromatic carboxyclic or heterocyclic radicals having from 6 to 20 carbon atoms, which can be substituted with from 1 to 4 monovalent radicals selected from C$_{(1-8)}$alkoxy, C$_{(1-8)}$alkyl, nitro or chloro. Ar is more particularly, phenyl, chlorophenyl, nitrophenyl, methoxyphenyl or pyridyl. Radicals included by Ar′ are divalent radicals such as

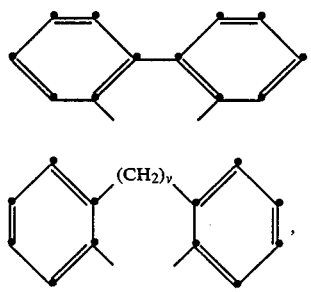

wherein the index v is preferably 1 or 2.

The iodonium salts are used in combination with a dye sensitiser.

Dyes which can be used in combination with the above identified aryliodonium salts in the practice of the invention are cationic dyes, such as shown in Vol. 20, p. 194–7 of the Kirk-Othmer Encyclopedia, 2nd Edition, 1969, John Wiley and Sons, New York. Some of the cationic dyes which can be used are, for example, Acridine orange; C.I. 46005
Acridine yellow; C.I. 46035
Phosphine R; C.I. 46045
Benzoflavin; C.I. 46065
Setoflavin T; C.I. 49005.

In addition to the above, basic dyes can also be used. Some of these basic dyes are shown in Vol. 7, p. 532–4 Kirk-Othmer Encyclopedia, as cited above and include Hematoporphyrin
4,4′-bisdimethylaminobenzophenone and
4,4′-bisdiethylaminobenzophenone.

When R is a cation of formula (iii), the initiator may have the formula (III)

$$[Y-Z-(CO)_x]^+ \ [LQ_m]^- \qquad (III)$$

wherein Y, Z, x, L, Q and m are as defined above.

When Y denotes an arene group i.e., is itself a 6-electron ligand, this may be a mononuclear or polynuclear group, including a condensed ring group. Preferably it is a hydrocarbon group, optionally substituted by one or more alkoxy groups, and preferably it contains from 6 to 18 carbon atoms, such as benzene, toluene, mesitylene, naphthalene, biphenyl, phenanthrene, fluorene, and anthracene.

When Y denotes a dienylium group it is preferably a cyclic group of one of the following formulae

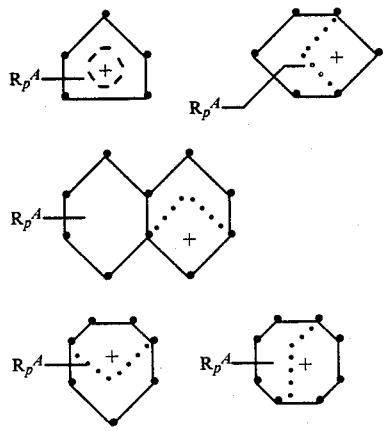

where $R^A$ denotes an alkyl group of 1 to 4 carbon atoms, an alkoxy group of 1 to 4 carbon atoms, or an alkyl group interrupted by one or more oxycarbonyl groups and containing up to 12 carbon atoms, and p is zero, 1, 2 or 3.

Z preferably represents chromium, cobalt, nickel, and particularly iron or manganese.

Individual salts of formula III, where Y denotes an arene group, which are particularly preferred include the hexafluorophosphates of π-toluenetricarbonylmanganese, π-benzenetricarbonylmanganese, π-mesitylenetricarbonylmanganese, π-1-methyl-5,6,7,8-tetrahydronaphthalenetricarbonylmanganese, π-hexylbenzenetricarbonylmanganese, π-methoxybenzene tricarbonylmanganese, and π-hexyloxybenzenetricarbonylmanganese.

These salts satisfy the requirement that the central atom (manganese) has a closed electron shell configuration, i.e. 18 electrons in its valency shell, univalent manganese in the unipositive cation contributing 6 electrons, the arene group contributing 6 electrons, and the three carbonyl groups contributing 2 electrons each.

Salts of formula III are in general known and can be prepared as described in EP-A No. 94,914.

Individual salts of formula III, where Y denotes a cyclic dienylium group, which are particularly preferred include tricarbonyl(cyclohexa-1,3-dienylium)iron tetrafluoroborate, tricarbonyl(1-methylcyclohexa-2,4-dienylium)iron hexafluorophosphate, tricarbonyl(1-methyl-4-methoxycyclohexa-2,4-dienylium)iron hexafluorophosphate, tricarbonyl(2-methoxybicyclo[4.4.0-]deca-2,4-dienylium)iron hexafluorophosphate, tricarbonyl(1-(acetoxy-methyl)-2-(methoxycarbonylacetoxy)ethylcyclohexa-2,4-dienylium)-iron hexafluorophosphate, tricarbonyl(1-ethyl-4-isopropoxycyclohexa-2,4-dienylium)iron hexafluorophosphate, tricarbonyl(1-(methoxycarbonyl)-4-methoxycyclohexa-2,4-dienylium)iron tetrafluoroborate, and (π-cyclohexadienyl)-tricarbonyl iron II hexafluoroarsenate.

These salts likewise satisfy the requirement that the central atom (iron) has a closed electron shell configuration, the iron contributing 7 electrons, the dienylium group contributing 5, and the carbonyl groups also contributing 2 each (i.e. 18 in all).

When R is an aromatic diazonium ion, the aromatic group may be unsubstituted or substituted by one or more arylthio, aryloxy, dialkylamino, alkyl or alkoxy groups.

When R is a metallocenium ion, the initiator may have the formula (IV)

$$[(R^1)(R^2M)_a]^{+an\frac{an}{q}} \ [LQ_m]^{-q} \qquad (IV)$$

wherein a is 1 or 2, each of n and q independently of the other is an integer from 1 to 3, M is the cation of a monovalent to trivalent metal from groups IVb to VIIb, VIII or Ib of the Periodic Table, L, Q and m are as defined above, $R^1$ is a π-arene and $R^2$ is a π-arene or the anion of a π-arene.

Possible π-arenes $R^1$ and $R^2$ are, in particular, aromatic groups of 6 to 24 carbon atoms or heteroaromatic groups of 3 to 30 carbon atoms, which groups may be unsubstituted or mono- or polysubstituted by identical or different monovalent radicals such as halogen atoms, preferably chlorine or bromine atoms, or $C_1$–$C_8$ alkyl, $C_1$–$C_8$ alkoxy, cyano, $C_1$–$C_8$ alkylthio, $C_2$–$C_6$ monocarboxylic acid alkyl ester, phenyl, $C_2$–$C_5$ alkanoyl or benzoyl groups. These π-arene groups may be mononuclear, condensed polynuclear or non-condensed polynuclear systems, in which last-mentioned systems the nuclei may be linked together direct or through bridge members such as —S—, —O— or —C≡C—.

$R^2$ as the anion of a π-arene may be an anion of a π-arene of the aforementioned kind, e.g. the indenyl anion, and, in particular, the cyclopentadienyl anion, which anions may also be unsubstituted or mono- or ppolysubstituted by identical or different monovalent radicals such as $C_1$–$C_8$ alkyl, $C_2$–$C_6$ monocarboxylic acid alkyl ester, cyano, $C_2$–$C_5$ alkanoyl or benzoyl groups.

Alkyl, alkoxy, alkylthio, monocarboxylic acid alkyl ester and alkanoyl substituents may be straight chain or branched. Typical alkyl, alkoxy, alkylthio, monocarboxylic acid alkyl ester or alkanoyl substituents are: methyl, ethyl, n-propyl, isopropyl, n-butyl, sec-butyl, tert-butyl, n-pentyl, n-hexyl, n-octyl, methoxy, ethoxy, n-propoxy, isopropoxy, n-butoxy, n-hexyloxy, n-octyloxy, methylthio, ethylthio, n-propylthio, isopropylthio, n-butylthio, n-pentylthio and n-hexylthio, carboxylic acid methyl ester and n-pentyl ester, acetyl, propionyl, butyryl, and valeroyl. Alkyl, alkoxy, alkylthio and monocarboxylic acid alkyl ester groups containing 1 to 4 and especially 1 or 2 carbon atoms in the alkyl moieties and alkanoyl groups containing 2 or 3 carbon atoms are preferred. Preferred substituted π-arenes or anions of substituted π-arenes are those containing one or two of the above-mentioned substituents, in particular chlorine or bromine atoms, methyl, ethyl, methoxy, ethoxy, cyano, carboxylic acid methyl or ethyl ester groups and acetyl groups.

$R^1$ and $R^2$ may be identical or different π-arenes. Suitable heteroaromatic π-arenes are systems containing S-, N- and/or O-atoms. Heteroaromatic π-arenes containing S- and/or O-atoms are preferred. Examples of suitable π-arenes are: benzene, toluene, xylenes, ethylbenzene, cumene, methoxybenzene, ethoxybenzene, dimethoxybenzene, p-chlorotoluene, chlorobenzene, bromobenzene, dichlorobenzene, acetylbenzene, trimethylbenzene, trimethoxybenzene, naphthalene, 1,2-dihydronaphthalenes, methoxynaphthalenes, ethoxynaphthalenes, chloronaphthalenes, bromonaphthalenes, biphenyl, stilbene, indene, fluorene, phenanthrene, anthracene, 9,10-dihydroanthracene, triphenylene, pyrene, perylene, naphthacene, coronene, thiophene, chromene, xanthene, thioxanthene, benzothiophene, naphthothiophene, thianthrene, diphenylene oxide, diphenylene sulphide, acridine and carbazole.

If a is 2, then each $R^2$ is preferably the anion of a π-arene, and each M is an identical metal atom. Examples of anions of substituted π-arenes are: the anions of methyl-, ethyl-, n-propyl and n-butylcyclopentadiene, the anions of dimethylcyclopentadiene, of cyclopentadiene carboxylic acid methyl ester and ethyl ester, and of acetylcyclopentadiene, propionyl-cyclopentadiene, cyanocyclopentadiene and benzoylcyclopentadiene. Preferred anions are the anion of unsubstituted indenyl and especially an anion of unsubstituted cyclopentadiene.

The preferred value of a is 1, $R^1$ is benzene, toluene, xylene, cumene, methoxybenzene, chlorobenzene, p-chlorotoluene, naphthalene, methylnaphthalene, chloronaphthalene, methoxynaphthalene, biphenyl, indene, pyrene, perylene or diphenylene sulfide, and $R^2$ is the anion of cyclopentadiene, acetyl-cyclopentadiene or indene, or benzene, toluene, xylene, trimethylbenzene, naphthalene or methylnaphthalene.

M is e.g. $Ti^+$, $Ti^{2+}$, $Ti^{3+}$, $Zr^+$, $Zr^{2+}$, $Zr^{3+}$, $Hf^+$, $Hf^{2+}$, $Hf^{3+}$, $Nb^+$, $Nb^{2+}$, $Nb^{3+}$, $Cr^+$, $Mo^+$, $Mo^{2+}$, $W^+$, $W^{2+}$, $Mn^+$, $Mn^{2+}$, $Re^+$, $Fe^{2+}$, $Co^{2+}$, $Co^{3+}$, $Ni^{2+}$ or $Cu^{2+}$. Preferably, M is a chromium, cobalt, manganese, tungsten or molydenum cation, especially an iron cation, most preferably $Fe^{2+}$.

Particularly preferred are complexes of formula IV, wherein a is 1, $R^1$ is cumene, $\eta^6$-pyrene or $\eta^6$-naphthalene, and $R^2$ is the anion of $\eta^5$-cyclopentadiene, n is preferably 1 or 2, especially 1, and q is preferably 1.

The compounds of formula IV may be prepared by methods known per se, e.g. as described in EP-A No. 94,915.

Examples of suitable metals or non-metals L in the ion $[LQ_m]^{-q}$ in all the above compounds are Sb, Fe, Sn, Bi, Al, Ga, In, Ti, Zr, Sc, V, Cr, Mn and Cu; lanthanides such as Ce, Pr, and Nd, or actinides, such as Th, Pa, U or Np. Suitable non-metals are especially B, P and As. Preferably L is P, As, B or Sb, with P and Sb being most preferred.

Examples of complex anions $[LQ_m]^{-q}$ are $BF_4^-$, $PF_6^-$, $AsF_6^-$, $SbF_6^-$, $SbF_5(OH)^-$, $FeCl_4^-$, $SnCl_6^{2-}$, $SbCl_6^-$, $BiCl_6^-$. The most preferred complex anions are $SbF_6^-$, $BF_4^-$, $AsF_6^-$ and $PF_6^-$.

In some cases when a compound of formula IV is used as polymerisation initiator, it may be used in conjunction with an organic peroxide or hydroperoxide or a quinone, or heat may be applied after irradiation, if irradiation alone is insufficient to effect solidification. Combinations of preferred compounds of formula IV and an oxidizing agent are described in EP-A No. 126,712.

A range of organic peroxides may be used such as 2,5-dimethyl-2,5-bis(benzoyl-peroxy) hexane, 2,5-dimethyl-2,5-bis(tert.butylperoxy) hexane, di-tert.butyl peroxide, dihexylene glycol peroxide, tert.butyl cumylperoxide, isobutyl methyl ketone peroxide, and also per-acids and per-esters such as perbenzoic acid, tert.butyl peracetate, tert.butyl perbenzoate and tert.butyl perphthalate. Organic hydroperoxides which may be used include alkyl, aryl or aralkyl hydroperoxides having up to 18 carbon atoms. Typical hydroperoxides include methyl ethyl ketone hydroperoxide, tert.butyl hydroperoxide, cumene hydroperoxide and hydroperoxides formed by the oxygenation of cetene or cyclohexene, tert.butyl hydroperoxide and cumene hydroperoxide being especially effective. Suitable quinones include benzoquinone.

Polymerisation initiators for (A) include onium salts. Onium salts which, when combined with an epoxide resin or other cationicallypolymerisable substances, give photopolymerisable mixtures, are described in U.S. Pat. Nos. 4,058,400 and 4,058,401. Suitable sulphoxonium salts that may be used for the same purposes are disclosed in U.S. Pat. Nos. 4,299,938, 4,339,567 and 4,383,025. Iodonium salts that may also be used for this purpose are described in British Pat. Specification No. 1,516,352. Iodosyl salts that may be used are described in European Pat. Specification No. 0,104,143.

Materials having photosensitive groups which may be used as the curable residue (C) are well known and include those having at least two, and preferably three or more, groups which are azido, coumarin, stilbene, maleimido, pyridinone, chalcone, propenone, pentadienone, anthracene, or α,β-ethylenically unsaturated ester groups having aromaticity or ethylenic unsaturation in conjugation with the α,β-unsaturation.

Another type of possible photocurable residue (C) is cationically polymerisable material that is rendered photosensitive by addition of a suitable photoinitiator (D). Combinations of these types may be selected from the compound classes as described for (A) and (B).

The curable residue (C) may be an acrylic ester, in particular a compound containing at least two groups of formula $$CH_2=CR^3—COO—  \qquad (V)$$

where $R^3$ represents a hydrogen or chlorine atom, or a methyl or ethyl group.

Suitable esters having at least two groups of formula V include esters, especially acrylates and methacrylates, of aliphatic, cycloaliphatic, alicycloaliphatic, araliphatic or heterocycloaliphatic polyhydric alcohols, especially diols and triols; poly-hydroxy-, pariculary dihydroxy-, carboxylic acids; polyhydroxy-, particularly dihydroxy-, alkylamines; and polyhydroxy-, particularly dihydroxy-, alkylnitriles. Acrylic ester-urethanes and -ureides may also be used. Such esters are, in general, commercially available, and any that are not may be prepared by known methods.

Suitable acrylic esters include those of formula

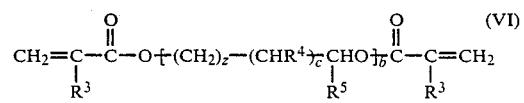

where $R^3$ is as herebefore defined, $R^5$ denotes H, —CH$_3$, —C$_2$H$_5$, —CH$_2$OH, or

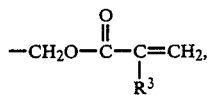

$R^4$ denotes H, OH, or

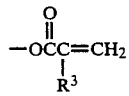

z is an integer of from 1 to 8,
b is an integer of from 1 to 20, and
c is zero or 1.

Among compounds of formula VI, those where z is from 1 to 4, b is from 1 to 5 and $R^3$ denotes a hydrogen atom or a methyl group are preferred. Specific examples of such compounds are the diacrylates and dimethacrylates of ethylene glycol, propylene glycol, butane-1,4-diol, diethylene glycol, dipropylene glycol, triethylene glycol, tripropylene glycol, tetraethylene glycol and tetrapropylene glycol.

Other suitable acrylic esters are of formula:

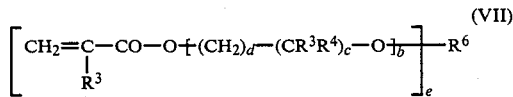

where
b, c, $R^3$ and $R^4$ have the meanings assigned above, d is zero or a positive integer, provided that c and d are not both zero,
e is 2, 3 or 4, and
$R^6$ denotes an organic radical of valency e linked through a carbon atoms or carbon atoms thereof to the indicated b oxygen atoms.

Preferred among compounds of formula VII are those where b, c, and d are each 1, $R^3$ is a hydrogen atom or methyl group and $R^6$ is a hydrocarbon residue of an aliphatic polyhydric alcohol having from 2 to 6 carbon atoms, such as a pentaerythrityl group. A specific example of such compounds is pentaerythrityl tetrakis (dimethylene glycol acrylate).

Yet other suitable esters are those of formula:

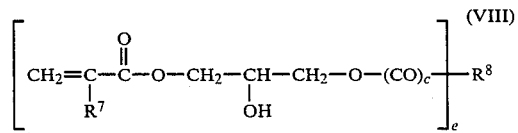

where
c and e have the meanings previously assigned,
$R^7$ denotes —H or —CH$_3$, and
$R^8$ denotes an organic radical of valency e, linked through a carbon atom thereof other that the carbon atom of a carbonyl group.

More particularly, when c is zero, $R^8$ may denote the residue, containing from 1 to 60 carbon atoms, of an alcohol or phenol having e hydroxyl groups.

$R^8$ may thus represent an aromatic, araliphatic, alkaromatic, cycloaliphatic, heterocyclic, or heterocycloaliphatic group, such as an aromatic group containing only one benzene ring, optionally substituted by chlorine, bromine or an alkyl group of from 1 to 9 carbon atoms, or an aromatic group comprising a chain of two to four benzene rings, optionally interrupted by ether oxygen atoms, aliphatic hydrocarbon groups of 1 to 4 carbon atoms, or sulphone groups, each benzene ring being optionally substituted by chlorine, bromine or an alkyl group of from 1 to 9 carbon atoms, or a saturated or unsaturated, straight or branched-chain aliphatic group, which may contain ether oxygen linkages and which may be substituted by hydroxyl groups, especially a saturated or monoethylenically unsaturated straight chain aliphatic hydrocarbon group of from 1 to 8 carbon atoms.

Specific examples of such groups are the aromatic groups of the formulae —C$_6$H$_4$C(CH$_3$)$_2$C$_6$H$_4$—, in which case e is 2, and
—C$_6$H$_4$(CH$_2$C$_6$H$_3$)$_f$—CH$_2$C$_6$H$_4$— where f is 1 or 2, in which case e is 3 or 4, and the aliphatic groups of formula
—CH$_2$CHCH$_2$— or —CH$_2$CH(CH$_2$)$_3$CH$_2$—, in which case e is 3, or of formula —(CH$_2$)$_4$—, —CH$_2$CH=CHCH$_2$—, —CH$_2$CH$_2$OCH$_2$CH$_2$—, or —(CH$_2$CH$_2$O)$_2$CH$_2$CH$_2$—, in which case e is 2.

When c is 1, $R^8$ may represent the residue, containing from 1 to 60 carbon atoms, of an acid having e carboxyl groups, preferably a saturated or ethylenically unsaturated, straight chain or branched aliphatic hydrocarbon group of from 1 to 20 carbon atoms, which may be substituted by chlorine atoms and which may be interrupted by ether oxygen atoms and/or by carbonyloxy (—COO—) groups, or a saturated or ethylenically unsaturated cycloaliphatic or aliphatic-cycloaliphatic hydrocarbon group of at least 4 carbon atoms, which may be substituted by chlorine atoms, or an aromatic hydrocarbon group of from 6 to 12 carbon atoms which may be substituted by chlorine or bromine atoms.

Further preferred compounds where c is 1 are those in which $R^8$ represents a saturated or ethylenically unsaturated straight chain or branched aliphatic hydrocarbon group of from 1 to 8 carbon atoms, optionally substituted by a hydroxyl group, or a saturated or ethylenically unsaturated straight chain or branched aliphatic hydrocarbon group of from 4 to 50 carbon atoms and interrupted in the chain by carbonyloxy groups, or a saturated or ethylenically unsaturated monocyclic or bicyclic cycloaliphatic hydrocarbon group of 6 to 8 carbon atoms, or an ethylenically unsaturated cycloaliphatic-aliphatic hydrocarbon group of from 10 to 51 carbon atoms, or a mononuclear aromatic hydrocarbon group of from 6 to 8 carbon atoms.

Specific examples of these residues of carboxylic acid are those of formula —CH$_2$CH$_2$—, —CH=CH— and —C$_6$H$_4$— where e is 2.

Specific examples of suitable compounds of formula VIII are 1,4-bis(2-hydroxy-3(acryloyloxy)propoxy)butane, poly(2-hydroxy-3-(acryloyloxy)propyl)ethers of bis(4-hydroxyphenyl)methane (bisphenol F), 2,2-bis(4-hydroxyphenyl)propane (bisphenol A) and phenol-formaldehyde novolaks, bis(2-hydroxy-3-acryloyloxypropyl)-adipate and the methacryloyloxy analogues of these compounds.

Still other suitable esters are acrylate-urethanes and actrylateureides of formula:

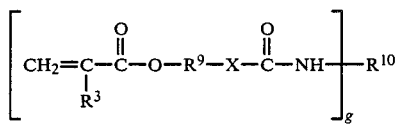

(IX)

where

R³ has the meaning assigned above,

R⁹ denotes a divalent aliphatic, cycloaliphatic, aromatic or araliphatic group, bound through a carbon atom or carbon atoms thereof to the indicate —O— atom and —X— atom or group, X denotes —O—, —NH— or —N(alkyl)—, in which the alkyl radical has from 1 to 8 carbon atoms, g is an integer of at least 2 and at most 6, and R¹⁰ denotes a g-valent cycloaliphatic, aromatic, or araliphatic group bound through a carbon atom or carbon atoms thereof to the indicate NH groups.

Preferably R⁹ denotes a divalent aliphatic group of 2 to 6 carbon atoms and R¹⁰ denotes one of the following:

a divalent aliphatic group of 2 to 10 carbon atoms, such as a group of formula

—(CH₂)₆—, —CH₂C(CH₃)₂CH₂CH(CH₃)(CH₂)₂—, or

—CH₂CH(CH₃)CH₂C(CH₃)₂(CH₂)₂—; or a phenylene group, optionally substituted by a methyl group or a chlorine atom; a naphthylene group; a group of formula —C₆H₄C₆H₄—, —C₆H₄CH₂C₆H₄—, or —C₆H₄C(CH₃)₂C₆H₄—; or a mononuclear alkylcycloalkylene or alkylcycloalkylalkylene group of from 6 to 10 carbon atoms, such as a methylcyclohex-2,4-ylene, methylcyclohex-2,6-ylene, or 1,3,3-trimethylcyclohex-5-ylene-methyl group.

Specific examples of compounds of formula IX are 2,4- and 2,6-(bis(2-acryloyloxyethoxycarbonamido))toluene and the corresponding methacryloyloxy compounds.

Further suitable acrylic esters are those of formula

(X)

where

R³ has the meaning assigned above,

R¹¹ denotes CH₃—, C₂H₅—, —CH₂OH or CH₂=C(R³)COOCH₂—, and

R¹² denotes —CH₂OH or —CH₂OOC—C(R³)=CH₂, especially 1,1,1-trimethylolpropane triacrylate, pentaerythritol tetraacrylate and the corresponding methacrylates.

Still further suitable acrylic esters are those of formula

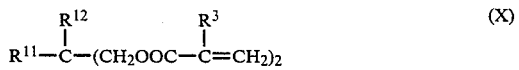

(XI)

where

R³ has the meaning assigned above,

R¹³ denotes —H, —CH₃ or —CH₂Cl, and

R¹⁴ denotes a tetravalent residue, containing up to 20 carbon atoms and one or more carbocyclic rings, of a tetracarboxylic acid after removal of four carboxyl groups, each indicate pair of groups —COOCH(R¹³)CH₂OOCC(R³)=CH₂ and —COOH being directly linked to adjacent carbon atoms.

Preferably, R³ and R¹³ are —H or —CH₃ and R¹⁴ is the residue of an aromatic tetracarboxylic acid having one or two benzene rings, especially pyromellitic acid or benzophenone-3,3', 4,4'-tetracarboxylic acid.

Any of the above acrylic esters may be used in combination and may be mixed with a diluent, particularly an acrylic ester having a low viscosity such as an alkyl or hydroxyalkyl acrylate or methacrylate.

Examples of suitable azides are those containing at least two groups of formula

N₃Ar— where Ar denotes a mononuclear or dinuclear divalent aromatic radical containing in all from 6 to at most 14 carbon atoms, especially a phenylene or naphthylene group.

Examples of suitable coumarines are those containing groups of the formula

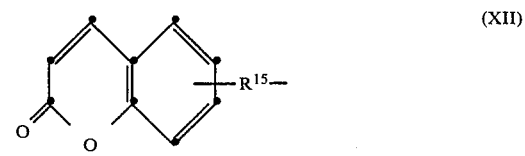

(XII)

where R¹⁵ is an oxygen atom, a carbonyloxy group (—COO—), a sulphonyl group, or a sulphonyoxy group.

Examples of those containing stilbene groups are those containing groups of the formula

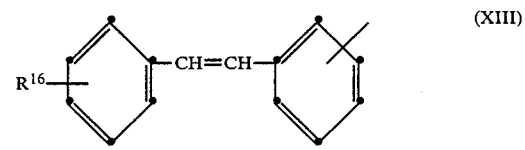

(XIII)

where R¹⁶ is the residue, containing up to 8 carbon atoms in all, of a five or six-membered nitrogen-containing heterocyclic ring, fused to a benzene or naphthalene nucleus, and linked through a carbon atom of the said heterocyclic ring adjacent to a nitrogen hetero atom thereof to the indicated benzene nucleus, such as a benzimidazolyl, benzoxazolyl, benzotriazolyl, benzothiazolyl, or a naphthotriazolyl residue.

Examples of those containing maleimide units are those having groups of the formula

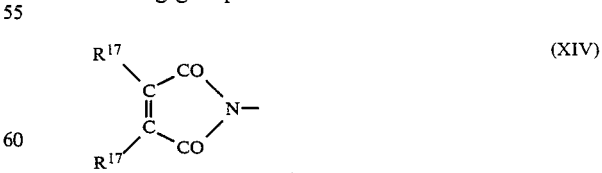

(XIV)

where each R¹⁷ is an alkyl group of 1 to 4 carbon atoms, a chlorine atom, or a phenyl group, and especially a methyl group or one of the groups R¹⁷ can be hydrogen and the other one is as defined above.

Examples of those containing pyridinone units are those having groups of the formula

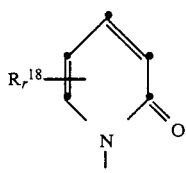 (XV)

where
R[18] is an aliphatic or cycloaliphatic radical of 1 to 8 carbon atoms and
r is zero or an integer of 1 to 4.

Examples of compounds containing chalcone, propenone, and pentadienone groups are those containing groups of formula

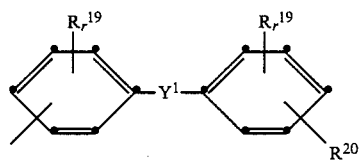 (XVI)

or

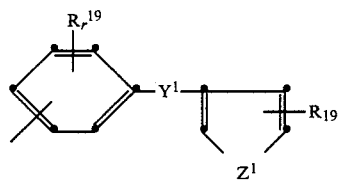 (XVII)

where
each R[19] is a halogen atom, or an alkyl, cycloalkyl, alkenyl cycloalkenyl, alkoxy, cycloalkoxy, alkenoxy, cycloalkenoxy, alkoxycarbonyl, cycloalkoxycarbonyl, alkenoxycarbonyl or cycloalkenoxycarbonyl group, such organic groups containing 1 to 9 carbon atoms, or is a nitro group, or a carboxyl, sulphonic, or phosphoric acid group in the form of a salt.

r has the meaning previously assigned,
R[20] represents a valency bond or a hydrogen atom,
Y[1] represents a grouping of formula

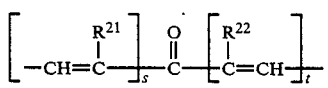 (XVIII)

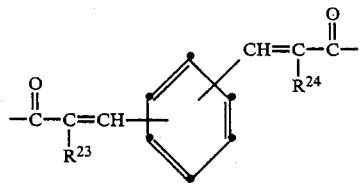 (XIX)

or

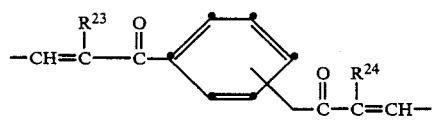 (XX)

R[21] and R[22] are each individually a hydrogen atom, an alkyl group, e.g. of 1 to 4 carbon atoms, or an aryl group, preferably a mononuclear group such as a phenyl group, or R[21] and R[22] conjointly denote a polymethylene chain of 2 to 4 methylene groups, R[23] and R[24] are each a hydrogen atom, an alkyl group, e.g. of 1 to 4 carbon atoms, or an aryl group which is preferably a mononuclear group such as a phenyl group, s and t are each zero, 1, 2, with the proviso that they are not both zero, and Z' is an oxygen or sulphur atom.

Suitable anthracenes are those containing anthryl groups, such as 1-, 2- or 9-anthryl groups, which are unsubstituted or have one or two bromo, chloro, methyl or nitro substituents.

Suitable conjugated unsaturated esters include those containing sorbate or cinnamate groups, such as disorbates or polyoxyalkylene glycols, polyvinyl cinnamates and epoxy resin-cinnamic acid reaction products.

Other suitable residues (C) are the cationically polymerisation residues listed above for residues (A).

The radiation activated initiator (D) that polymerises the residue (C) when exposed to actinic radiation, may be sensitive to visible light or to ultraviolet radiation.

Such initiators are known and include benzoin ethers, acyloin ethers, halogenated alkyl or aryl derivatives, aromatic carbonyl derivatives, metallocenes, mixtures of Group IVA organometallic compounds with photoreducible dyes, mixtures of quinones with aliphatic amines having hydrogen attached to an aliphatic alpha carbon atom, aliphatic dicarbonyl compounds, optionally mixed with an amine, 3-ketocoumarins, acyl phosphine oxides, metal carbonyls, onium salts, as described above, and mixtures of photoreducible dyes with reducing agents. Preferred radiation activated catalysts (D) are camphorquinone with a tertiary amine having a hydrogen atom attached to an aliphatic alpha carbon atoms, such as bis(4-dimethylamino)benzophenone and triethanolamine, biacetyl, dimanganese decacarbonyl, benzil dimethyl ketal, 1-benzoylcyclohexanol, $\alpha,\alpha$-dimethyl-$\alpha$-N-morpholino-4-methylthioacetophenone, isobutyl benzoin ether, 2,2,2-trichloro-4'-tert-.butylacetophenone, diethoxyacetophenone, coumarins having a carbocyclic or heterocyclic aromatic ketone group in the 3-position, such as 3-benzoyl-7-methoxy coumarin or 3-(4-cyanobenzoyl)-5,7-dipropoxy coumarin, mixtures of photoreducible dyes, typically methylene blue or rose bengal, with a stannane such as trimethyl benzyl stannane, tributyl 4-methylbenzyl stannane or dibutyl dibenzyl stannane, mixtures of photoreducible dyes with an electron donor such as sodium benzenesulphinate or benzenesulphinic acid, and a titanium metallocene such as bis(pimethylcyclopentadienyl) bis(sigma hexyloxytetrafluorophenyl)titanium (IV).

Preferred metallocenes that are used in the compositions are the titanocenes of formula:

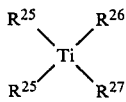 (XXI)

where
each group R[25] is independently selected from an optionally substituted cyclopentadienyl or indenyl group or together they form an alkylidene group of 2 to 12 carbon atoms, a cycloalkylidene group having from 5 to 7 carbon atoms in the ring, a group —Si(R[28])$_2$— or —Sn(R$^{28}$)$_2$—, or an optionally substituted group of formula

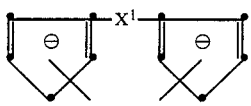

X$^1$ denotes a methylene, ethylene, or 1,3-propylene group,

R$^{26}$ denotes a 6-membered carbocyclic or 5- or 6-membered heterocyclic aromatic ring, substitutes by a fluorine atom or a —CF$_3$ group in at least one of the two positions ortho to the metal-carbon bond, the ring optionally being further substituted, or R$^{26}$ with R$^{27}$ denotes a group —Q$^1$—Y$^2$—Q$^1$—, Q$^1$ denotes a 5- or 6-membered carbocyclic or heterocyclic aromatic ring, in which each of the two bonds is ortho to the Q$^1$—Y$^2$ bond, and each position meta to the Q$^1$—Y$^2$ bond is substituted by fluorine or —CF$_3$, the groups Q$^1$ optionally being further substituted, Y$^2$ denotes a methylene group, an alkylidene group having from 2 to 12 carbon atoms, a cycloalkylidene group having from 5 to 7 carbon atoms in the ring, a direct bond, a group —NR$^{28}$—, an oxygen or sulphur atom, or a group —SO$_2$—, —CO—, —Si(R$^{28}$)$_2$— or —Sn(R$^{28}$)$_2$—, R$^{27}$ denotes an alkynyl or phenylalkynyl group that may be substituted, an azido or cyano group, or a group of formula —Si(R$^{28}$)$_2$— or —Sn(R$^{28}$)$_2$—, or it has the same meaning as the group R$^{26}$, and R$^{28}$ denotes an alkyl group of from 1 to 12 carbon atoms, a cycloalkyl group of from 5 to 12 carbon atoms, an aryl group of from 6 to 16 carbon atoms, or an aralkyl group of from 7 to 16 carbon atoms.

The R$^{25}$ groups are preferably identical. Suitable substituents for R$^{25}$ are: linear or branched alkyl, alkoxy and alkenyl of 18, preferably 12, most preferably up to 6, carbon atoms, e.g. methyl, ethyl, propyl, isopropyl, n-butyl, tert-butyl, pentyl, hexyl, octyl, decyl, docecyl, tetradecyl, hexadecyl, octadecyl and corresponding alkenyl and alkoxy groups; cycloalkyl and cycloalkenyl containing preferably 5 to 8 ring carbon atoms. e.g. cyclopentyl, cyclohexyl, cycloheptyl, methylcylopentyl and methylcyclohexyl; aryl of prefereably 6 to 16 carbon atoms and aralkyl or preferably 7 to 16 carbon atoms, e.g. phenyl, naphthyl, biphenyl, benzyl and phenylethyl; nitrilo, halogen, preferably F, Cl and Br, and also amino, preferably tertiary amino which may contain linear or branched alkyl groups containing up to 12, preferably 1 to 6 carbon atoms, especially methyl, ethyl, phenyl and benzyl groups. These amino groups may be quaternized, especially with linear or branched alkyl halides containing preferably 1 to 12 carbon atoms, especially 1 to 6 carbon atoms, preferably methyl or ethyl halides; linear or branched aminoalkyl, preferably tertiary aminoalkyl which may also be quaternised, in particular with alkyl halides, and the alkylene group in the aminoalkyl can be linear or branched and contains preferably 1 to 12, most preferably 1 to 6, carbon atoms, and is most preferably β-branched C$_1$-C$_{12}$alkyl.

The radicals R$^{25}$ may contain 1 to 3 substituents, but preferably contain one substituent. It is preferred that both substituents R$^{25}$ are cyclopentadienyl$^\ominus$ or methylcyclopentadienyl$^\ominus$.

Alkylidene groups X$^1$ and Y$^2$ preferably contain 2 to 6 carbon atoms. Examplary of alkylidene groups and cycloalkylidene groups X$^1$ and Y$^2$ are: ethylidene, 2,2-propylidene, butylidene, hexylidene, phenylmethylene, diphenyl-methylene, cyclopentylidene and cyclohexylidene. X$^1$ is most preferably methylene, R$^{28}$ as alkyl preferably contains 1 to 6 carbon atoms and is e.g. methyl, ethyl, propyl, butyl or hexyl; R$^{28}$ as cycloalkyl is preferably cyclopentyl or cyclohexyl; and as aryl is preferably phenyl; and as aralkyl is preferably benzyl.

R$^{26}$ is preferably substituted in both ortho-positions by fluorine or by —CF$_3$.

R$^{26}$ as carbocyclic aromatic and fluorine-substituted ring may be indene, indane, fluorene, naphthalene and preferably phenyl. Examples are: 4,6-difluoroinden-5-yl, 5,7-difluoroind-6-yl, 2,4-difluorofluoren-3-yl, 1,3-difluoronaphth-2-yl and, preferably, 2,6-difluorophen-1-yl.

R$^{26}$ as heteroxcyclic aromatic 5-membered ring preferably contains one hetero-atom, as 6-membered ring, contains preferably 1 or 2 hetero-atoms. Examples of such rings substituted by two fluorine atoms are: 2,4-difluoropyrrol-3-yl, 2,4-difluorofur-3-yl, 2,4-difluorothiophen-3-yl, 2,4-difluoropyrid-3-yl, 3,5-difluoropyrid-4-yl and 4,6-difluropyrimid-5-yl.

R$^{26}$ and R$^{27}$ together as a group of formula —Q$^1$—Y$^2$—Q$^1$— may be e.g.:

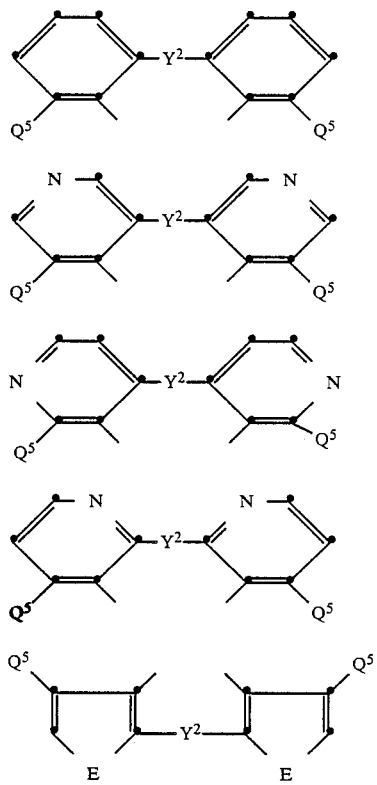

and

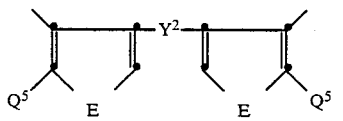

wherein E is —O—, —S— or —NH—. Y$^2$ is preferably methylene, ethylidene, 2,2-propylidene, a direct bond, or —O— and Q$^5$ is a fluorine atom or a —CF$_3$— group.

The radicals $R^{26}$ and the groups $Q^1$ in groups —$Q^1$—$Y^2$—$Q^1$— can be partly or completely substituted by further groups. Suitable groups are: linear or branched alkyl or alkoxy, each preferably of 1 to 18, most preferably 1 to 6, carbon atoms, e.g. methyl, ethyl, propyl, butyl, pentyl, hexyl, and the corresponding alkoxy groups, with methyl, methoxy and hexyloxy being preferred; cycloalkyl containing preferably 5 or 6 ring carbon atoms, aryl or preferably 6 to 16 carbon atoms and aralkyl of preferably 7 to 16 carbon atoms. e.g. cyclopentyl, cyclohexyl, phenyl or benzyl; hydroxyl, carboxyl, CN, halogen such as F, Cl or Br, and amino, preferably tertiary amino which may be quaternised with an alkyl halide such as methyl chloride, methyl bromide or methyl iodide, examples of amino groups being methylamino, ethylamino, dimethylamino, diethylamino, pyrrolidyl, piperidyl, piperazyl, morpholyl, N-methylpiperazyl; alkoxycarbonyl containing preferably 1 to 18, most preferably 1 to 6, carbon atoms in the alkoxy moiety, aminocarbonyl containing one or two $C_1$–$C_2$alkyl groups in the amino group, or aminocarbonyl containing heterocyclic amines such as pyrrolidine, piperidine, piperazine, N-methylpiperazine, and morpholine; aminoalkyl, especially tertiary aminoalkyl which preferably contains $C_1$–$C_6$alkyl groups and which may be quaternised with an alkyl halide, most preferably tertiary aminoalkyl which may be substituted by $C_1$–$C_6$alkyl, e.g. dimethylaminomethyl and trimethylammoniummethyl iodide.

$R^{27}$ as alkynyl is e.g. 2-butynyl and, preferably, propargyl.

Examples of substituents for $R^{27}$ as phenylalkynyl are halogen such as F, Cl, Br, $C_1$–$C_6$alkyl and $C_1$–$C_6$alkoxy, carboxyl, OH and CN, $R^{27}$ preferably has the meaning of $R^{26}$.

In a preferred embodiment of the invention, $R^{26}$ and $R^{27}$ in formula XXI are unsubstituted or substituted 2,6-difluorophen-1-yl or $R^{26}$ and $R^{27}$ together form a radical of the formula:

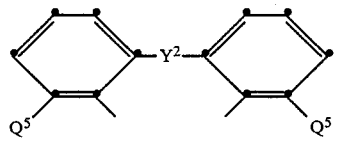

wherein $Y^2$ and $Q^5$ have the above meaning and $Y^2$ is in particular a direct bond, —$CH_2$— or —O—.

A preferred group of metallocenes of the formula XXI comprises those compounds wherein each $R^{25}$ is $\pi$-cyclopentadienyl or $\pi$-cyclopentadienyl which is substituted by $C_1$–$C_4$alkyl, preferably methyl, and each of $R^{26}$ and $R^{27}$ is a radical of the formula:

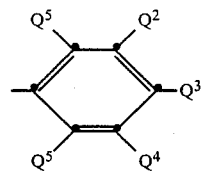

XXIa wherein each of $Q^2$, $Q^3$ and $Q^4$ independently is a hydrogen atom, F, Cl, Br, a tertiary amino group, preferably morpholino group, or an alkoxy group, preferably a methoxy or hexyloxy group and $Q^5$ is as defined above. The amino or alkoxy group is preferably attached in the para-position to the free bond. A preferred subgroup comprises those metallocenes of the formula XXI, wherein each $R^{25}$ is $\pi$-methylcyclopentadienyl or $\pi$-cyclopentadienyl, and each of $R^{26}$ and $R^{27}$ is a radical of the formula XXIa wherein $Q^2$ and $Q^4$ are H, F, Cl or Br and $Q^3$ is H, F or alkoxy. Preferably, each of $Q^2$ and $Q^4$ independently is a hydrogen or fluorine atom, and $Q^3$ is fluorine, or hexyloxy.

Compounds of formula XXI, and their preparation, are described in EP-A No. 122,223 or in EP-A No. 186,626.

Preferred Group IVA organometallic compounds used as initiators (D) are organostannanes of formula XXII:

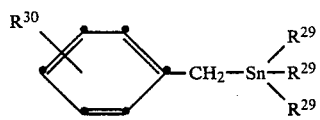

XXII wherein
$R^{29}$ denotes an alkyl group of from 1 to 4 carbon atoms, or an alkenyl or alkynyl group of from 2 to 4 carbon atoms, and
$R^{30}$ denotes a hydrogen or halogen atom or an alkyl or alkoxy group of from 1 to 4 carbon atoms.

Preferred compounds of formula XXII are those where $R^{29}$ denotes an alkyl group of 1 to 4 carbon atoms and $R^{30}$ denotes a hydrogen atom or an alkyl group of 1 to 4 carbon atoms.

These organostannanes are prepared by Grignard coupling of a benzyl magnesium halide with a trialkylthin halide in an inert solvent, followed by filtration, aqueous washing and distillation of the product.

Preferred photoreducible dyes that are used with these organostannanes are methylene blue and rose bengal.

It will be seen that residues (A) and residues (C) may apparently be the same. In any one composition they will always be different from each other, as it is important that residues (A) and residues (C) are polymerised at different wavelengths. It does not matter whether residue (A) is polymerised at a longer or shorter wavelength than residue (C) provided that only residue (A) is polymerised during the first exposure to radiation. The choice of residues (A) to (D) will be made to achieve this object.

For example, where solidifcation due to cationic polymerisation of residue (A) takes place at a shorter wavelength than the subsequent cross-linking of residue (C), one of the "onium" salts described would be suitable for initiator (B) together with a metallocene or other compound activated at long wavelengths as initiator (D). A preferred combination is the use of an onium salt as initiator (B) together with a titanocene of formula XXI, or an organostannate of formula XXII plus a photoreducible dye, as initiator (D).

Also it will be noted that epoxy resins are given as possible compounds for both residues (A) and residues (C). It is possible to use an epoxy resin as residue (A) and also an epoxy resin as residue (C) provided that appropriate resins together with an appropriate initiator (B) and catalyst (D) are chosen so that one is polymerised at one wavelength and one at a different wavelength. One preferred combination is a cycloaliphatic epoxide as residue (A); a ferrocenium salt as initiator (B), preferably with the $BF_4^-$ or $PF_6^-$ anions; a glycidyl ether as residue (C); and an "onium" salt as catalyst (D). In this case, residue (A) will be polymerised by irradiation at one wavelength, and residue (C) by irradiation at a shorter wavelength.

If desired the cationically polymerisable residue (A) and the radiation curable residue (C) may form part of the same molecule, i.e. a dual-functional material. Preferred dual functional materials are those containing an ester of an ethylenically unsaturated monocarboxylic acid, particularly an ester group of formula V, with an epoxide group. Such dual-functional materials include glycidyl acrylate, glycidyl methacrylate and materials prepared by reaction of an unsaturated monocarboxylic acid with a stoichiometric deficit of a di- or polyepoxide.

The weight ratio of cationically polymerisable residue (A) to radiation curable residue (C) is not critical, als long as effective amounts of both components are used. Where (A) and (C) are on separate molecules, the weight ratio (A):(C) is generally within the range 1:0.1–10, especially 1:1–5. The amount of polymerisation initiator (B) that is used is also not critical, as long as there is enough to initiate polymerisation of (A) after the first exposure to actinic radiation. Typical amounts of (B) are within the range 0.1–50 parts by weight of (B) per 100 parts of (A), especially 0.2 to 10 parts.

The amount of organic peroxide of hydropeoxide may vary from 0.01% to 15% by weight of residue (A), amounts of from 0.1% to 10% by weight generally being used.

The liquid compositions used in the present invention may also contain further additives known and conventionally employed in the technology of photopolymerisable materials. Examples of such additives are pigments, dyes, fillers and reinforcing agents, glass fibres, carbon fibres and other fibres, flame retardants, antistatic agents levelling agents, antioxidants, light stailisers and surfactants.

Suitable sources of actinic radiation include carbon arcs, mercury vapour arcs, fluorescent lamps with phosphors emitting ultraviolet light, argon and hexon glow lamps, tungsten lamps, and photographic flood lamps. It is important that the first irradiation is effected using radiation of a different wavelength from that used in the second irradiation. The use of filters, to screen out irradiation of the unwanted wavelengths, may be found to be advantageous since, in this way, a single, wide spectrum source of irradiation may be used. If such a single source of radiation is used, the first exposure is effected with a filter allowing such wavelengths to reaching the composition that will activate only polymeristion initiator (B). In the second exposure, the whole unfiltered spectrum of radiation may be used, so that the wavelength which effects cure of residue (C) can reach the composition.

The first exposure need only be long enough to activate the polymerisation initiator (B). Usually a few minutes is sufficient. The actual time needed can be readily determined by simple experiment. The activated initiator (B), optionally in the presence of an organic peroxide or hydroperoxide causes residue (A) to polymerise. In some cases when using a compound of formula IV as initiator (B), some heating may also be needed to assist the polymerisation. The composition may be heated to polymerise residue (A) for example at a temperature of 80° C. to 120° C. There is no need to heat any longer than the time needed to polymerise residue (A), a few minutes being sufficient. The actual temperature and time needed can be readily detemined by simple experiment. Curing may also take place by exposing to infra red irradiation after the first exposure.

The compositions as described may be applied as a liquid to a substrate such as steel, aluminium, copper, paper, silicon or plastics. After the coating has been applied, the first exposure takes place, and, depending on the specific system, a heated step is carried out. This treatment results in solidification of the composition. The coated substrate is then stable and may be stored for prolonger periods away from actinic irradiation of the wavelength that will effect cure of (C). When desired, the coated substrate is given an imagewise exposure to actinic radiation of a different wavelength from that used in the first exposure. Those parts of the coating that have not received the second exposure may then be removed, usually by washing in a suitable solvent such as cyclohexanone, 2-ethoxyethanol, gamma butyrolactone, toluene, acetone, and mixtures thereof, or, depending on the resins in the formulation, by treatment with aqueous solvents such as dilute aqueous sodium carbonate or sodium hydroxide. Dry development, such as plasma etching, may also be used. Thus the process of this invention may be used in the production of printing plates and printed circuits, using well known techniques.

The invention is illustrated by the following Examples. In the Examples the resins used are:

Resin 1: This denotes 4-bromophenylglycidyl ether.

Resin 2: This is prepared by the following method: Bisphenol A diglycidyl ether (250 g) is heated to 120° C. and a mixture of acrylic acid (94.9 g), chromium III trisoctanoate (0.16 g; 5% solution in ligroin) and 2,6-di-tert.butyl-4-methylphenol (0.5 g) is added dropwise with stirring. Heating is continued for 5 hours, by which time the epoxide content of the mixture is negligible. The product, Resin 2 is 2,2-bis(4-(3-acryloyloxy-2-hydroxypropoxy)phenyl) propane.

Resin 3: This denotes trimethylolpropane trisacrylate.

Resin 4: This denotes alpha pinene oxide.

Resin 5: This denotes 3,4-epoxycyclohexylmethyl-3',4'-epoxycyclohexane carboxylate.

Resin 6: This denotes an o-cresol novolak polyglycidyl ether having a softening point of 99° C. and an epoxide content of 4.2 equivalents/kg.

Resin 7: This is prepared by the following method: A 2,2-bis(4-hydroxyphenyl)propane based epoxy resin having an epoxide content of 1.6 equivalents/kg. (100 g) and 2,6-di-tert.butyl-4-methylphenol (0.1 g) is heated until molted, stirred together and heated to 130° C. A mixture of acrylic acid (10.7 g), chromium III trisoctanoate (0.1 g; 5% solution in ligroin) and 2,6-di-tert.butyl-4-methylphenol (0.2 g) is added dropwise over 30 minutes with stirring. Heating is continued for 2 hours, by which time the epoxide content of the mixture is negligible. This gives Resin 7.

Resin 8: This denotes phenylglycidyl ether.

Resin 9: This denotes pentaerithyritol tetraacrylate.

Resin 10: This denotes dibromocresylglycidylether.

Resin 11: This is prepared by the following method: 1,5-bis(4-glycidyloxyphenyl)penta-1,4-dien-3-one (50 g), dodecanoic acid (25 g) and chromium III tris octanoate (0.2 g, 5% solution in ligroin) are heated at 120° C. until molten. Stirring is started and heating continued at 120° C. for 2 hours, by which time the epoxide content of the mixture is 1.65 mol/kg$^{-1}$. This is diluted with phenylglycidylether (75 g) to give Resin 11.

Resin 12: This is prepared according to the procedure described in J. Polym. Sci. - Polym. Chem. (1983) 21 1785. 4-Bromophenol (17.3 g, 0.1 mole), powdered sodium hydroxide (6 g, 0.15 mole) and dimethylsulphoxide (30 ml) are stirred together under a nitrogen blanket for 30 minutes at 25° C., followed by 2 hours at 70° C. 2-Chloroethylvinylether (16 g, 0.15 mole) is added dropwise over 30 minutes, ensuring the temperature does not exceed 80° C. When the addition is complete, it is stirred at 70° C. for a further 4 hours. This is then cooled and added to water (100 ml). The precipitate is collected by vacuum filtration and dried under vacuum at 40° C.

In the following Examples different radiation sources are used:

(I) 500 W tungsten lamp: This source emits radiation above 450 nm. Radiation of shorter wavelength is cut-off by a filter.

(II) 500 W metal halide lamp: This source mainly emits radiation of 340–450 nm wavelength.

(III) 80 W/cm medium pressure mercury arc lamp: This source mainly emits radiation of 200–400 nm wavelength.

EXAMPLE 1

A mixture of Resin 1 (4.5 parts), Resin 5 (0.5 parts), Resin 2 (5 parts), $(pi^5$-2,4-cylopentadien-1-yl)-[(1,2,3,4,5,6-pi)-(1-methyl-ethyl)-benzene]-iron II hexafluorophosphate (0.25 part), benzyl-dimethylketal (0.15 part), cumene hydroperoxide (0.3 part) and acetone (0.5 part) is stirred until a solution is obtained.

The mixture is coated onto copper-clad laminate in a layer 36 micrometres thick. The coated laminate is then irradiated using a 500 W tungsten-halogen lamp at a distance of 20 cm for 10 minutes. The solidified coating is then irradiated through a transparency using a 5000 W metal halid lamp at a distance of 75 cm for 2 minutes. Development in a mixture of propylene carbonate (5 parts), butyl digol (=diethylenglycol monobutylether) (3 parts) and gamma butylactone (2 parts) produces a negative image of the transparancy.

EXAMPLE 2

A mixture of Resin 5 (5 parts), Resin 3 (5 parts), $(pi\text{-}^5\text{-}$2,4-cyclopentadien-1-yl) (pi-trans stilbene) iron II hexafluorophosphate (0.25 part), 1-hydroxycyclohexylphenyl ketone (0.15 part), cumene hydroperoxide (0.1 part) and acetone (0.5 part) is stirred until a solution is obtained.

The mixture is coated onto copper-clad laminate in a layer 36 micrometres thick. The coated laminate is then irradiated using a 500 W tungsten-halogen lamp at a distance of 20 cm for 10 minutes. The solidified coating is then irradiated through a transparency using a 5000 W metal halid lamp at a distance of 75 cm for 3 minutes. Development in tetrahydrofuran produces a negative image of the transparency.

EXAMPLE 3

A mixture of Resin 2 (5 parts), Resin 4 (5 parts), $(pi^5$-2,4-cyclopentadien-1-yl) [(1,2,3,4,5,6-pi)-(1-methyl-ethyl)-benzene]-iron II hexafluorophosphate (0.25 part), benzildimethylketal (0.15 part), cumene hydroperoxide (0.15 part) and acetone (0.5 part) is stirred until a solution is obtained.

The mixture is coated onto copper-clad laminate in a layer 36 micrometres thick. The coated laminate is then irradiated using a 500 W tungsten-halogen lamp at a distance of 20 cm for 8 minutes. The solidified coating is then irradiated through a transparency using a 5000 W metal halide lamp at a distance of 75 cm for 5 minutes. Development in tetrahydrofuran produces a negative image of the transparency.

EXAMPLE 4

A mixture of Resin 2 (6.5 parts), Resin 4 (3.5 parts), $(pi^5$-2,4-cyclopentadien-1-yl) [(1,2,3,4,5,6-pi)-1-methyl-ethyl-benzene]-iron II hexafluoroantimonate (0.2 part), 2-methyl-1-(4-methylthio)phenyl-2-morpholino-propan-1-one (0.2 part), methyldiethanolamine (0.05 part), cumene hydroperoxide (0.25 part) and acetone (0.5 part) is stirred until a solution is obtained.

The mixture is coated onto copper-clad laminate in a layer 36 micrometres thick. The coated laminate is then irradiated using a 500 W tungsten-halogen lamp at a distance of 20 cm for 5 minutes. The solidified coating is then irradiated through a transparency using a 5000 W metal halide lamp at a distance of 75 cm for 5 minutes. Development in tetrahydrofuran, with rubbing, produces a negative image of the transparency.

EXAMPLE 5

A mixture of Resin 5 (3.5 parts), Resin 2 (6.5 parts), diphenyliodonium hydrofluoroarsenate (0.2 part), acridine orange (0.02 part), benzildimethylketal (0.2 part) and acetone (0.5 part) is stirred until a solution is obtained.

The mixture is coated onto copper-clad laminate in a layer 36 micrometres thick. The coated laminate is then irradiated using a 500 W tungsten-halogen lamp at a distance of 20 cm for 3 minutes. The solidified coating is then irradiated through a tgransparency using a 5000 W metal halide lamp at a distance of 75 cm for 5 minutes. Development in tetrahydrofuran, with rubbing, produces a negative image of the transparency.

EXAMPLE 6

A mixture of Resin 5 (1.25 parts) Resing 2 (7.5 parts), Resin 4 (1.25 parts), (pi-cyclohexadienyl)tricarbonyl iron II hexafluoroarsenate (0.2 parts), benzil dimethyl ketal (0.2 part) and acetone (0.5 part) is stirred until a solution is obtained.

The mixture is coated onto copper-clad laminate in a layer 36 micrometres thick. The coated laminate is then irradiated using a 500 W tungsten-halogen lamp at a distance of 20 cm for 20 minutes. The solidified coating is then irradiated through a transparency using a 5000 W metal halide lamp at a distance of 75 cm for 5 minutes. Development in tetrahydrofuran, with rubbing, produces a netgative image of the transparency.

EXAMPLE 7

A mixture of Resin 5 (1.25 parts), Resin 2 (7.5 parts), Resin 4 (1.25 parts), 2,5-diethoxy-4-(p-tolythio)benzene diazonium tetrafluoroborate (0.2 part), benzil dimethyl ketal (0.2 part), talc (1 part) and acetone (0.5 part) is stirred until homogeneous.

The mixture is coated onto copper-clad laminate in a layer 12 micrometres thick. The coated laminate is then irradiated using a 500 W tungsten-halogen lamp at a distance of 20 cm for 15 minutes. The solidified coating is then irradiated through a transparency using a 5000 W metal halide lamp at a distance of 75 cm for 5 minutes. Development in acetone produces a negative image of the transparency.

EXAMPLE 8

A mixture of Resin 5 (6.5 parts), Resin 6 (5 parts), (pi5-2,4-cyclopentadien-1-yl) [(1,2,3,4,5,6-pi)-(1-methylethyl)benzene]-iron II hexafluorophosphate (0.35 part), triphenylsulphonium hexafluoroantimonate (0.25 part) and propylene carbonate (0.25 part) is stirred until a solution is obtained.

The mixture is coated onto a copper-clad laminate in a layer 24 micrometres thick. The coated layer is then irradiated using a 500 W tungsten-halogen as described in Example 1 for 5 minutes. The solidified coating is then irradiated through a transparency using a 5000 W metal halide lamp at a distance of 75 cm for 3 minutes. Development in toluene with gentle rubbing produces a negative image of the transparency.

EXAMPLE 9

A mixture of Resin 1 (4 parts) Resin 2 (6 parts), p-chlorophenoxy-p-tolylphenoxysulphoxonium hexafluorophosphate (0.2 part), bis(pi-methylcyclopentadienyl) bis(sigma hexaneoxytetrafluorophenyl)titanium (IV) (0.1 part) and propylene carbonate (0.1 part) is stirred until a solution is obtained.

The mixture is coated onto a copper-clad laminate in a layer 24 micrometres thick. The coated layer is then irradiated using a 80 W/cm medium pressure mercury arc lamp at a distance of 20 cm for 20 seconds. The solidified coating is then irradiated through a transparency using a 5000 W metal halide lamp at a distance of 75 cm for 3 minutes. Development in a 2:1 v/v mixture of toluene:acetone with gentle rubbing produces a negative image of the transparency.

EXAMPLE 10

A mixture of Resin 2 (5 parts), Resin 4 (5 parts) bis(pi-methylcyclopentadienyl) bis(sigma hexaneoxytetrafluorophenyl)titanium (IV) (0.1 part), triphenylsulphonium hexafluoroantimonate (0.25 part) and propylene carbonate (0.25 part) is stirred until a solution is obtained.

The mixture is coated onto a copper-clad laminate in a layer 24 micrometres thick. The coated layer is then irradiated using a 80 W/cm medium pressure mercury arc lamp at a distance of 20 cm for 60 seconds. The solidified coating is then irradiated through a transparency using a 5000 w metal halide lamp at a distance of 75 cm for 3 minutes. Development in ethanol with gentle rubbing produces a negative image of the transparency.

EXAMPLE 11

A mixture of Resin 1 (5 parts), Resin 7 (5 parts), (pi5-2,4-cyclopentadien-1-yl) [(1,2,3,4,5,6-pi)-(1-methylethyl)-benzene]-iron II hexafluorophosphate (0.5 part), benzildimethylketal (0.5 part) and acetone (1 part) is stirred until a solution is obtained.

The mixture is coated onto copper-clad laminate in a layer 12 micrometres thick. The coated laminate is then irradiated using a 500 W tungsten-halogen lamp with a filter to cut out irradiation below 450 nm at a distance of 20 cm for 10 minutes and heated at 90° C. for 5 minutes to give a tack-free film. The solidified coating is then irradiated through a tgransparency using a 5000 W metal halide lamp producing radiation within a wavelength region of 340–450 nm, at a distance of 75 cm for 2 minutes. Development in propylene carbonate produces a negative image of the transparency.

EXAMPLE 12

A mixture of Resin 1 (2 parts), Resin 5 (4 parts), Resin 2 (4 parts), (pi5-2,4-cyclopentadien-1-yl) [(1,2,3,4,5,6-pi)-(1-methylethyl)-benzene]-iron II hexafluorophosphate (0.6 part), benzildimethylketal (0.4 part) and acetone (0.5 part) are stirred until a solution is obtained.

The mixture is coated onto a copper-clad laminate in a layer 12 micrometres thick and the coating solidified by irradiation using a 500 W tungsten-halogen lamp at a distance of 20 cm for 3 minutes followed by heating at 90° C. for 3 minutes. The solidified coating is then irradiated through a transparency using a 5000 W metal halide lamp at a distance of 75 cm for 2 minutes. Development in 1,1,1-trichloroethane produces a negative image of the transparency.

EXAMPLE 13

A mixture of Resin 5 (5 parts), Resin 2 (2.5 parts), Resin 3 (10 parts), (pi5-2,4-cyclopentadien-1-yl) [(1,2,3,4,5,6-pi)-(1-methylethyl)-benzene]-iron II hexafluorophosphate (0.5 part), benzildimethylketal (0.5 part), Orasol Red G (0.04 part) and acetone (0.5 part) is stirred until a solution is obtained.

The mixture is coated onto copper-clad laminate in a layer 36 micrometres thick and the coating solidified by irradiation using a 500 W tungsten-halogen lamp at a distance of 20 cm for 30 seconds followed by heating at 90° C. for 5 minutes. The solidified coating is then irradiated through a transparency using a 5000 W metal halide lamp at a distance of 75 cm for 30 seconds. Development in propylene carbonate produces a negative image of the transparency.

EXAMPLE 14

A mixture of Resin 2 (7 parts), Resin 8 (3 parts), (pi5-2,4-cyclopentadiene-1-yl) [(1,2,3,4,5,6-pi)-(1-methylethyl)-benzene]-iron II hexafluorophosphate (0.3 part), benzildimethylketal (0.3 part) and acetone (1 part) is stirred until a solution is obtained.

The mixture is coated onto copper-clad laminate in a layer 12 micrometres thick and the coating solidified by irradiation using a 500 W tungsten-lamp at a distance of 20 cm for 300 seconds followed by heating at 90° C. for 5 minutes. The solidified coating is then irradiated through a transparency using a 5000 W metal halide lamp at a distance of 75 cm for 120 seconds. Development in a 8:2 v/v mixture of toluene and tetrahydrofuran produces a negative image of the transparency.

EXAMPLE 15

A mixture of Resin 5 (1 part), Resin 4 (1 part), Resin 9 (1 part), (pi5-2,4-cyclopentadien-1-yl) [(1,2,3,4,5,6-pi)-(1-methyl-ethyl)-benzene]-iron II hexafluorophosphate (0.1 part), benzildimethylketal (0.1 part), anthracene (0.05 part) and acetone (0.3 part) is stirred until a homogeneos mixture is obtained.

The mixture is coated onto copper-clad laminate in a layer 12 micrometres thick and the coating solidified by irradiation using a 500 W tungsten-halogen lamp at a distance of 20 cm for 5 minutes followed by heating at 90° C. for 5 minutes. The solidified coating is then irradiated through a transparency using a 5000 W metal halide lamp at a distance of 75 cm for 2 minutes. Development in a 6:4 v/v mixture of ethanol and acetone produces a negative image of the transparency.

EXAMPLE 16

A mixture of Resin 5 (5 parts), Resin 2 (5 parts), (pi⁵-2,4-cyclopentadien-1-yl) [(1,2,3,4,5,6-pi)-(1-methylethyl)-benzene]-iron II hexafluorophosphate (0.5 part), 2-methyl-1-(methylthio)phenyl-2-morpholinopropan-1-one (0.5 part) and acetone (1 part) is stirred until a solution is obtained.

The mixture is coated onto copper-clad laminate in a layer 12 micrometres thick and the coating solidified by irradiation using a 500 W tungsten-halogen lamp at a distance of 20 cm for 3 minutes followed by heating at 90° C. for 5 minutes. The solidified coating is then irradiated through a transparency using a 5000 W matel halide lamp at a distance of 75 cm for 2 minutes. Development in a 6:4 v/v mixture, of 1,1,1-trichloroethane and acetone produces a negative image of the transparency.

EXAMPLE 17

A mixture of Resin 2 (6 parts), Resin 10 (4 parts), (pi⁵-2,4-cyclopentadien-1-yl) [(1,2,3,4,5,6-pi)-(1-methylethyl)-benzene]-iron II hexafluorophosphate (0.5 part), benzildimethylketal (0.5 part) and acetone (1 part) is stirred until a solution is obtained.

The mixture is coated onto copper-clad laminate in a layer 36 micrometres thick and the coating solidified by irradiation using a 500 W tungsten-halogen lamp at a distance of 20 cm for 10 minutes followed by heating at 120° C. for 5 minutes. The solidified coating is then irradiated through a transparency using a 5000 W metal halide lamp at a distance of 75 cm for 2 minutes. Development in a mixture of propylene carbonate (5 parts), butyl digol (3 parts) and gamma butyrolactone (2 parts) produces a negative image of the transparency.

EXAMPLE 18

A mixture of Resin 1 (5 parts), Resin 2 (5 parts), (pi⁵-2,4-cyclopentadienyl) (pi⁶-trans stilbene) iron II hexafluorophosphate (0.5 part), benzildimethylketal (0.5 part) and acetone (1 part) is stirred until a solution is obtained.

The mixture is coated onto copper-clad laminate in a layer 36 micrometres thick. The coated laminate is then irradiated using a 500 W tungsten-halogen lamp with a filter to cut out irradiation below 450 nm at a distance of 20 cm for 10 minutes and heated at 120° C. for 10 minutes to give a tack-free film. The solidified coating is then irradiated through a transparency using a 5000 W metal halide lamp producing radiation within a wavelength at 340–450 nm, at a distance of 75 cm for 2 minutes. Development in a mixture of propylene carbonate (5 parts), butyl digol (3 parts) and gramma butyrolactone (2 parts) produces a negative image of the transparency.

EXAMPLE 19

A mixture of Resin 11 (2.5 parts), (pi⁵-2,4-cyclopentadienyl-1-yl) [(1,2,3,4,5,6-pi)-(1-methylethyl)-benzene]-iron II hexafluorophosphate (0.125 parts) are mixed until homogeneous.

The mixture is coated onto copper-clad laminate in a layer 36 micrometres thick and the coating solidified by irradiation using a 500 W tungsten-halogen lamp at a distance of 20 cm for 10 minutes followed by heat at 120° C. for 5 minutes. The solidified coating is then irradiated through a transparency using a 5000 W metal halide lamp at a distance of 75 cm for 5 minutes. This is then heated at 90° C. for 5 minutes and developed in 1,1,1-trichloroethane to give a negative image of the transparency.

EXAMPLE 20

A mixture of Resin 2 (2.5 parts), Resin 11 (0.5 parts), Resin 12 (2.0 parts), [(pi⁵-2,4-cyclopentadien-1-yl) (1,2,3,4,5,6-pi)-(1-methylethyl)-benzene]-iron II hexafluorophosphate (0.25 parts), benzildimethylketal (0.08 parts) and acetone (0.25 parts) is stirred until a solution is obtained.

The mixture is coated onto copper-clad laminate in a layer 36 micrometres thick and the coating solidified by irradiation using a 500 W tungsten-halogen lamp at a distance of 20 cm for 8 minutes followed by heat at 120° C. for 10 minutes. The solidified coating is then irradiated through a transparency using a 5000 W metal halide lamp at a distance of 75 cm for 2 minutes. Development in a mixture of propylene carbonate (5 parts), butyl digol (3 parts) and gamma butyrolactone (2 parts) produces a negative image of the transparency.

What is claimed is:

1. A process for the production of an image which comprises
   (i) applying to a substrate a layer of a liquid composition comprising
      (A) a cationically polymerisable residue
      (B) a radiation-activated polymerisation initiator for (A)
      (C) a radiation-curable residue that is different from (A) and optionally
      (D) a radiation activated initiator for the cure of (C),
   (ii) subjecting the composition to actinic radiation having a wavelength at which initiator (B) is activated but at which the residue (C) and/or the initiator (D) is not substantially activated, followed by heating, if necessary, so that (A) is polymerised and the layer of liquid composition is solidified, but remains photocurable,
   (iii) subjecting the solidified layer in a predetermined pattern to actinic radiation having a wavelength that is different from that of the radiation using in stage (ii) and at which the radiation curable residue (C) and/or the initiator (D) is activated, such that in the exposed areas (C) is substantially cured, and
   (iv) removing areas of the solidified layer that have not been substantially cured.

2. A process as claimed in claim 1 in which the liquid composition comprises one or more substances that are cationically polymerised, together with one or more substances that are polymerised by exposure to actinic radiation only at a shorter wavelength than that used to activate the polymerisation initiator (B).

3. A process as claimed in claim 1 in which the liquid composition comprises one or more dual-functinal substances having in the same molecule two types of photopolymerisation function, one of which is activated only by irradiation at a wavelength that is different from that at which the polymerisation initiator (B) is activated.

4. A process as claimed in claim 1 in which residue (A) is a 1,2-epoxide, a vinyl ether or a mixture thereof.

5. A process as claimed in claim 4 in which residue (A) is a glycidyl ether of an alcohol or phenol, a cycloaliphatic epoxide resin, a glycidyl ester, or a vinyloxyalkyl ether of a phenol.

6. A process as claimed in claim 1 in which the polymerisation initiator (B) is at least one compound of the formula (I)

$$R^{\oplus an} \frac{an}{q} [LQ_m]^{\ominus q}(I)$$

wherein L is a divalent to heptavalent metal or non metal, Q is a halogen atom or one of the groups Q may be a hydroxyl group, q is an integer from 1 to 3, m is an integer corresponding to the valency of L+q, a is 1 or 2, n is an integer from 1 to 3 and R is an ion selected from:

$$Ar—I^+—Ar' \qquad (i)$$

wherein Ar and Ar' are substituted or unsubstituted aromatic radicals;

$$[Y—Z—(CO)_x]^+ \qquad (ii)$$

wherein Y represents an arene or dienylium group; Z represents an atom of a d-block transition element chosen from titanium, vanadium, chromium, manganese, iron, cobalt, nickel, copper, niobium, molybdenum, ruthenium, rhodium, palladium, silver, tantalum, tungsten, rhenium, osmium, iridium, platinum, and gold; and x is a positive integer such that the atom Z has a closed shell electron configuration;

aromatic diazonium ions;                                              (iii)

$$[(R^1)(R^2M)_a]^{+an} \qquad (iv)$$

wherein a and n are as defined above, M is the cation of a monovalent to trivalent metal from groups IVb to VIIb, VIII of Ib of the Periodic Table; $R^1$ is a $\pi$-arene and $R^2$ is a $\pi$-arene or the anion of a $\pi$-arene;

aromatic sulphonium ions; or                             (v)

aromatic sulphoxonium ions.                               (vi)

7. A process as claimed in claim 6 in which the cation $R^{aan}$ of the polymerisation initiator (B) has the formula (iv) as defined in claim 6.

8. A process as claimed in claim 7 in which the composition also contains an organic peroxide or hydroperoxide or quinone.

9. A process as claimed in claim 7 in which the first irradiation is followed by heating to polymerise residues (A).

10. A process as claimed in claim 7, wherein M is a chromium, cobalt, manganese, tungsten, molybdenum or iron cation and in which the ion $[LQ]^{-q}$ is selected from $BF_4^-$, $PF_6^-$, $AsF_6^-$, $SbF_6^-$, $SbF_5(OH)^-$, $FeCl_4^-$, $SnCl_6^-$, $SbCl_6^-$ and $BiCl_6^-$.

11. A process as claimed in claim 1 in which curable residue (C) is a material having at least two groups which are azido, coumarin, stilbene, maleimido, pyridinone, chalcone, propenone, pentadienone, anthracene or $\alpha,\beta$-ethylenically unsaturated ester groups having aromatically or ethylenic unsaturation in configuration with the $\alpha,\beta$-unsaturation, or is a cationically polymerisable residue as defined for residue (A).

12. A process as claimed in claim 11 in which curable residue (C) is an acrylic ester containing at least two groups of formula VII $$CH_2=CR^3—COO— \qquad (VII)$$

where $R^3$ represents a hydrogen or chlorine atom or a methyl or ethyl group.

13. A process as claimed in claim 11 in which residue (C) is a 1,2-epoxide.

14. A process as claimed in claim 1 in which initiator (D) is selected from the group consisting of a benzoin ether, acyloin ether, halogenated alkyl or aryl derivative, aromatic carbonyl derivative, a metallocene, a mixture of a Group IV A metal organometallic compound with a photoreducible dye, a mixture of a quinone and an aliphatic amine having hydrogen attached to an aliphatic alpha carbon atom, an aliphatic dicarbonyl compound optionally mixed with an amine, a 3-ketocoumarin, an acyl-phosphine oxide, a metal carbonyl, an onium salt, or a mixture of a photoreducible dye with a reducing agent.

15. A process as claimed in claim 1 in which the weight ratio of cationically polymerisable residue (A) to radiation curable residue (C) is within the range 1:0.1-10 and in which 0.1 to 50 parts by weight of initiator (B) are present per 100 parts by weight of polymerisable residue (A).

16. A composition suitable for use in a process as claimed in claim 1 which comprises
(A) a cationically polymerizable residue;
(B) a radiation-activated polymerization initiator for (A) which is an onium salt;
(C) an acrylic ester; and
(D) a radiation-activated initiator for the cure of (C) which is a titanocene of formula XXI $$\begin{array}{c} R^{25} \\ \diagdown \\ \diagup \\ R^{25} \end{array} Ti \begin{array}{c} R^{26} \\ \diagdown \\ \diagup \\ R^{27} \end{array} \qquad (XXI)$$

where each group $R^{25}$ is independently a cyclopentadienyl or indenyl group, or said group having 1 to 3 substituents is substituted by alkyl of 1 to 18 carbon atoms, by alkenyl of 2 to 18 carbon atoms, by alkoxy of 1 to 18 carbon atoms, by cycloalkyl or by cycloalkenyl containing 5 to 8 ring carbon atoms, by aryl of 6 to 16 carbon atoms, by aralkyl of 7 to 16 carbon atoms, by cyano, by halogen, by amino, by tertiary amino containing alkyl of 1 to 12 carbon atoms, phenyl or benzyl, by quaternized amino with alkyl halides of 1 to 12 carbon atoms, by aminoalkyl of 1 to 12 carbon atoms, by tertiary aminoalkyl or by quaternized aminoalkyl, or together the two $R^{25}$ groups form alkylidene of 2 to 12 carbon atoms, cycloalkylidene having from 5 to 7 carbon atoms in the ring, $—Si(R^{28})_2—$ or $—Sn(R^{28})_2—$, or a group of the formula or said group substituted by 1 to 3 substituents as described for $R^{25}$ above, and where $X^1$ denotes methylene, ethylene or 1,3-propylene, $R^{26}$ denotes a 6-membered carbocyclic or 5- or 6-membered heterocyclic aromatic ring, substituted by a fluorine or by a $—CF_3$ group in at least one of the two positions ortho to the metal-carbon bond, or R²⁶ together with R²⁷ denotes a group —Q¹—Y²—Q¹—, Q¹ denotes a 5- or 6-membered carbocyclic or heterocyclic aromatic ring, in which each of the two bonds is ortho to the Q¹—Y² bond, and each position meta to the Q¹—Y² bond is substituted by fluorine or by —CF₃; or the radicals R²⁶ and the groups Q¹ are further substituted by alkyl of 1 to 18 carbon atoms, by alkoxy of 1 to 18 carbon atoms, by cycloalkyl of 5 or 6 ring carbon atoms, by aryl of 6 to 16 carbon atoms, by aralkyl of 7 to 16 carbon atoms, by hydroxyl, by carboxyl, by cyano, by halogen, by tertiary amino, by quaternized amino, by pyrrolidyl, by piperidyl, by piperazyl, by morpholyl, by N-methylpiperazyl, by alkoxycarbonyl, of 1 to 18 carbon atoms in the alkoxy moiety, by aminocarbonyl containing one or two alkyl groups of 1 to 12 carbon atoms on the amino, by pyrrolidinocarbonyl, by piperidinocarbonyl, by piperazinocarbonyl, by N-methylpiperazinocarbonyl, by morpholinocarbonyl, by aminoalkyl, by tertiary aminoalkyl or by quaternized aminoalkyl;

Y² denotes methylene, alkylidene of 2 to 12 carbon atoms, cycloalkylidene having 5 to 7 carbon atoms in the ring, a direct bond, a group —NR²⁸—, an oxygen atom, a sulfur atom, or a group —SO₂—, —CO—, —Si(R²⁸)₂— or —Sn(R²⁸)₂—, or R²⁷ has the same meaning as R²⁶, or R²⁷ is azido, cyano, alkynyl or phenylakynyl substituted by halogen, by alkyl of 1 to 6 carbon atoms, by alkoxy of 1 to 6 carbon atoms, by carboxyl, by hydroxyl or by cyano; or R²⁷ is —Si(R²⁸)₂— or —Sn(R²⁸)₂— where R²⁸ denotes alkyl of 1 to 12 carbon atoms, cycloalkyl of 5 to 12 carbon atoms, aryl of 6 to 16 carbon atoms or aralkyl of 7 to 16 carbon atoms; or an organostannane of formula XXII

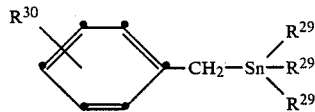

XXII wherein R²⁹ denotes alkyl of 1 to 4 carbon atoms, alkenyl of 2 to 4 carbon atoms or alkynyl of 2 to 4 carbon atoms, and R³⁰ denotes hydrogen, a halogen atom, alkyl of 1 to 4 carbon atoms or alkoxy of 1 to 4 carbon atoms.

17. A composition suitable for use in a process as claimed in claim 6 which comprises (A) a cationically polymerizable residue;

(B) a radiation-activated polymerization initiator for (A) which is at least one compound of formula (I)

$$R^{\oplus an} \frac{an}{q} [LQ_m]^{\ominus q} \quad (I)$$

where $R^{\oplus an}$ denotes an ion of formula $$([R^1)(R^2M)_a]^{+an}$$

and R¹, R², M, L, Q, a, n and q are as defined in claim 6;

(C) an acrylic ester; and (D) a radiation-activated initiator for the cure of (C) which is a benzoin ether, benzil dimethyl ketal, 1-benzoylcyclohexanol or 2-methyl-1-(4-methylthio)phenyl-2-morpholino-propan-1-one.

18. A composition suitable for use in a process as claimed in claim 6 which comprises (A) a cationically polymerizable residue (B) a radiation-activated polmerization initiator for (A) which is an iodonium salt of formula II $$[Ar_h — I — Ar_i']^{+j} [LQ_m]^{-(k-1)} \quad II$$

where

Ar, Ar', L, Q and m are as defined in claim 6, h is 0 and i is 1 or h is 2 and i is 0, j is k—1, k is greater than 1 and is an integer having a value up to 8, and 1 is the valence of L, in combination with a dye sensitizer;

(C) an acrylic ester; and (D) a radiation-activated initiator for the cure of (C) which is activated by irradiation at a shorter wavelength than that which activates initiator (B).

19. A composition suitable for use in a process as claimed in claim 3 which comprises a dual functional material having the cationially polymerizable residue (A) and the radiation-curable residue (C) in the same molecule, together with (B) a radiation-activated polymerization initiator for (A) which is the compound of formula IV $$[(R^1)(R^2M)_a]^{+an} \frac{an}{q} [LQ_m]^{-q} \quad (IV)$$

where

R¹ is a π-arene,

R² is a π-arene or the anion of a π-arene.

M is a cation of a monovalent to trivalent metal from Groups IVb to VIIb, VIII or Ib of the Periodic Table, L is a divalent to heptavalent metal or non-metal, Q is a halogen atom or one of the groups Q is a hydroxyl group and the remainder are halogen atoms, a is 1 or 2, m is an integer corresponding to the valency of L+q, n is an integer from 1 to 3 and q is an integer from 1 to 3, and (D) a radiation-activated initiator for the cure of (C) which is a benzoin ether, benzil dimethyl ketal, 1-benzoylcyclohexanol or 2-methyl-1-(4-methylthio)phenyl-2-morpholinopropan-1-one.

20. A composition suitable for use in a process according to claim 7 which comprises:

(A) a cycloaliphatic epoxide;

(B) a salt as defined in claim 7;

(C) a glycidyl ether; and (D) an onium salt.

* * * * *